(12) United States Patent
Kandadai et al.

(10) Patent No.: US 11,258,478 B1
(45) Date of Patent: Feb. 22, 2022

(54) AUTONOMOUSLY MOTILE DEVICE WITH RESIDUAL ECHO SUPPRESSION

(71) Applicant: Amazon Technologies, Inc., Seattle, WA (US)

(72) Inventors: Srivatsan Kandadai, San Jose, CA (US); Amit Singh Chhetri, Sunnyvale, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/573,679

(22) Filed: Sep. 17, 2019

(51) Int. Cl.
| | |
|---|---|
| *H04B 3/23* | (2006.01) |
| *G01S 13/50* | (2006.01) |
| *G01S 13/58* | (2006.01) |
| *H03H 21/00* | (2006.01) |
| *H04M 9/08* | (2006.01) |

(52) U.S. Cl.
CPC ............ *H04B 3/231* (2013.01); *G01S 13/505* (2013.01); *G01S 13/583* (2013.01); *H03H 21/0043* (2013.01); *H04M 9/082* (2013.01); *H03H 2021/0061* (2013.01)

(58) Field of Classification Search
CPC ..... G01S 13/505; G01S 13/583; H04B 3/231; H03H 21/0043; H03H 2021/0061; H04M 9/082

USPC ..................................................... 379/406.05
See application file for complete search history.

(56) References Cited

U.S. PATENT DOCUMENTS

| | | | | | |
|---|---|---|---|---|---|
| 5,396,517 | A | * | 3/1995 | Yedid ....................... | H04B 3/23 370/291 |
| 5,675,644 | A | * | 10/1997 | Sih ........................... | H04B 3/23 370/289 |
| 6,674,865 | B1 | * | 1/2004 | Venkatesh .............. | H04M 9/082 381/107 |
| 9,595,997 | B1 | * | 3/2017 | Yang .................... | G10L 21/0208 |
| 2006/0222172 | A1 | * | 10/2006 | Chhetri ................. | H04M 9/082 379/406.05 |
| 2007/0263850 | A1 | * | 11/2007 | Stokes .................. | H04M 9/082 379/406.01 |
| 2011/0032122 | A1 | * | 2/2011 | Hayashi .................. | G08G 1/04 340/943 |
| 2014/0093087 | A1 | * | 4/2014 | Kikuchi ................... | H03G 3/20 381/57 |

* cited by examiner

*Primary Examiner* — Hemant S Patel
(74) *Attorney, Agent, or Firm* — Pierce Atwood LLP

(57) ABSTRACT

A device capable of autonomous motion includes a residual echo suppressor for suppressing echoes caused by an output reference signal. When the device outputs audio while moving with a velocity, it may receive echoes that are Doppler-shifted due to the motion. The residual echo suppressor generates estimated residual error data based on phase-shifted reference data to account for and suppress the Doppler-shifted echoes.

21 Claims, 13 Drawing Sheets

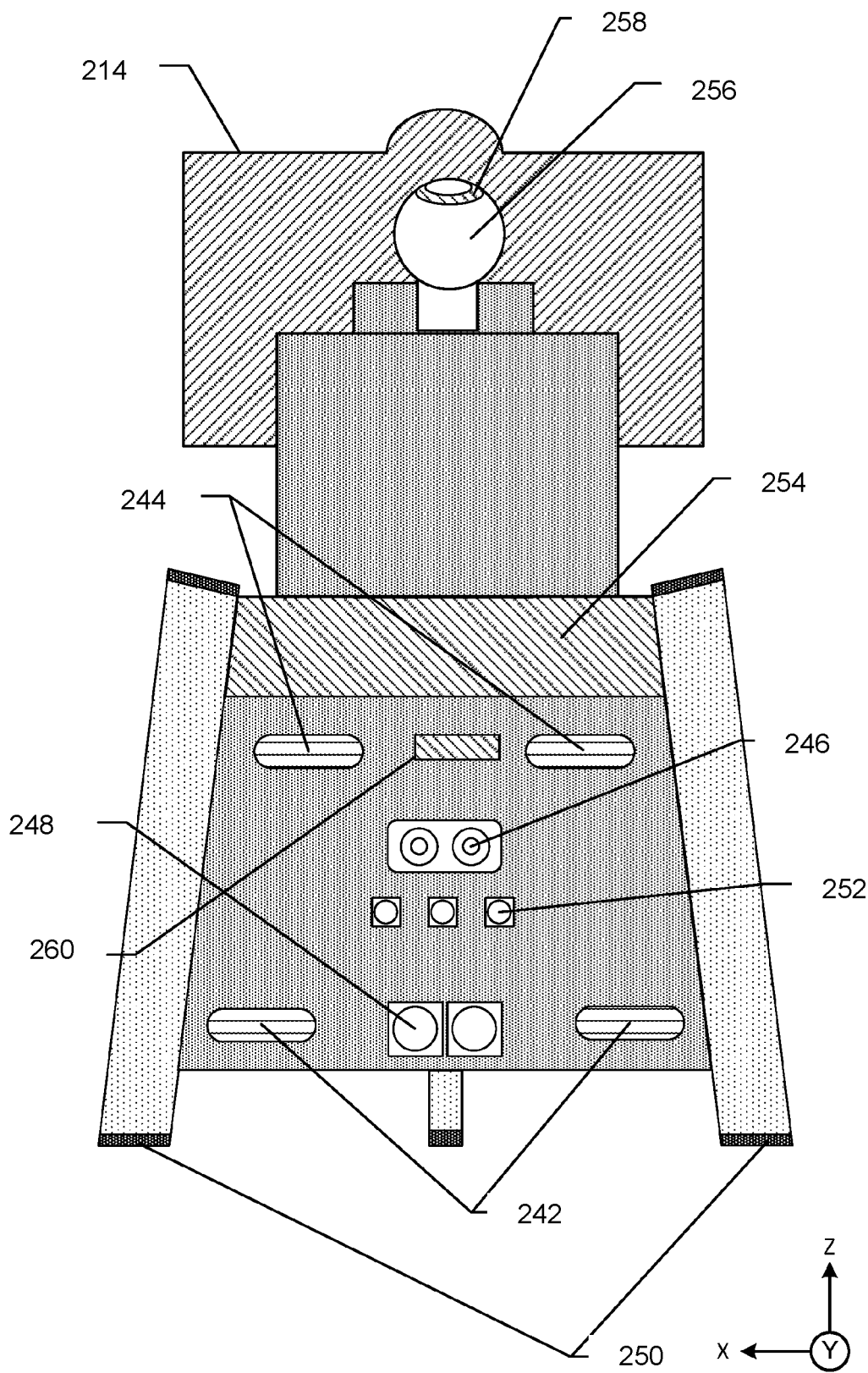

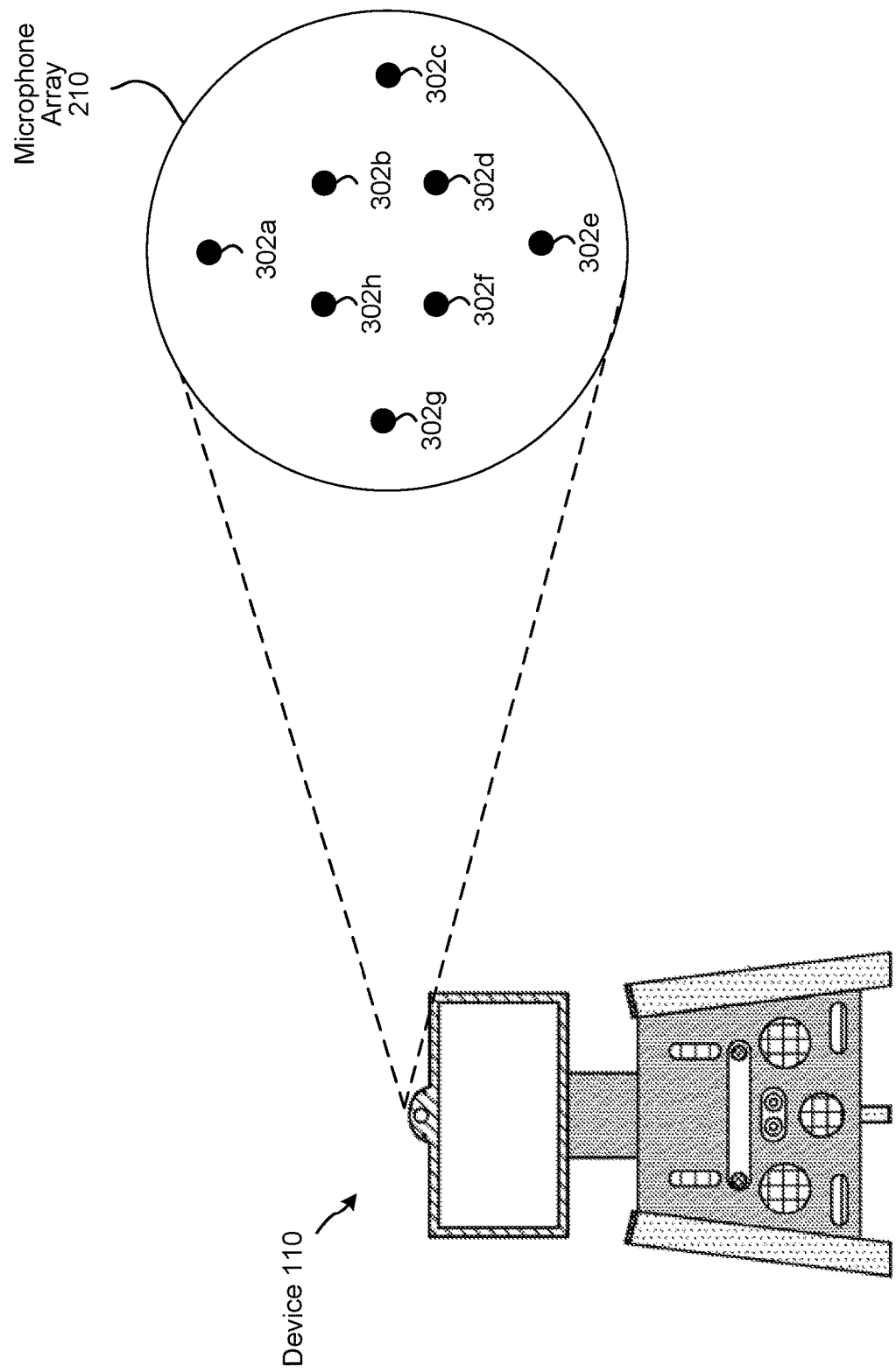

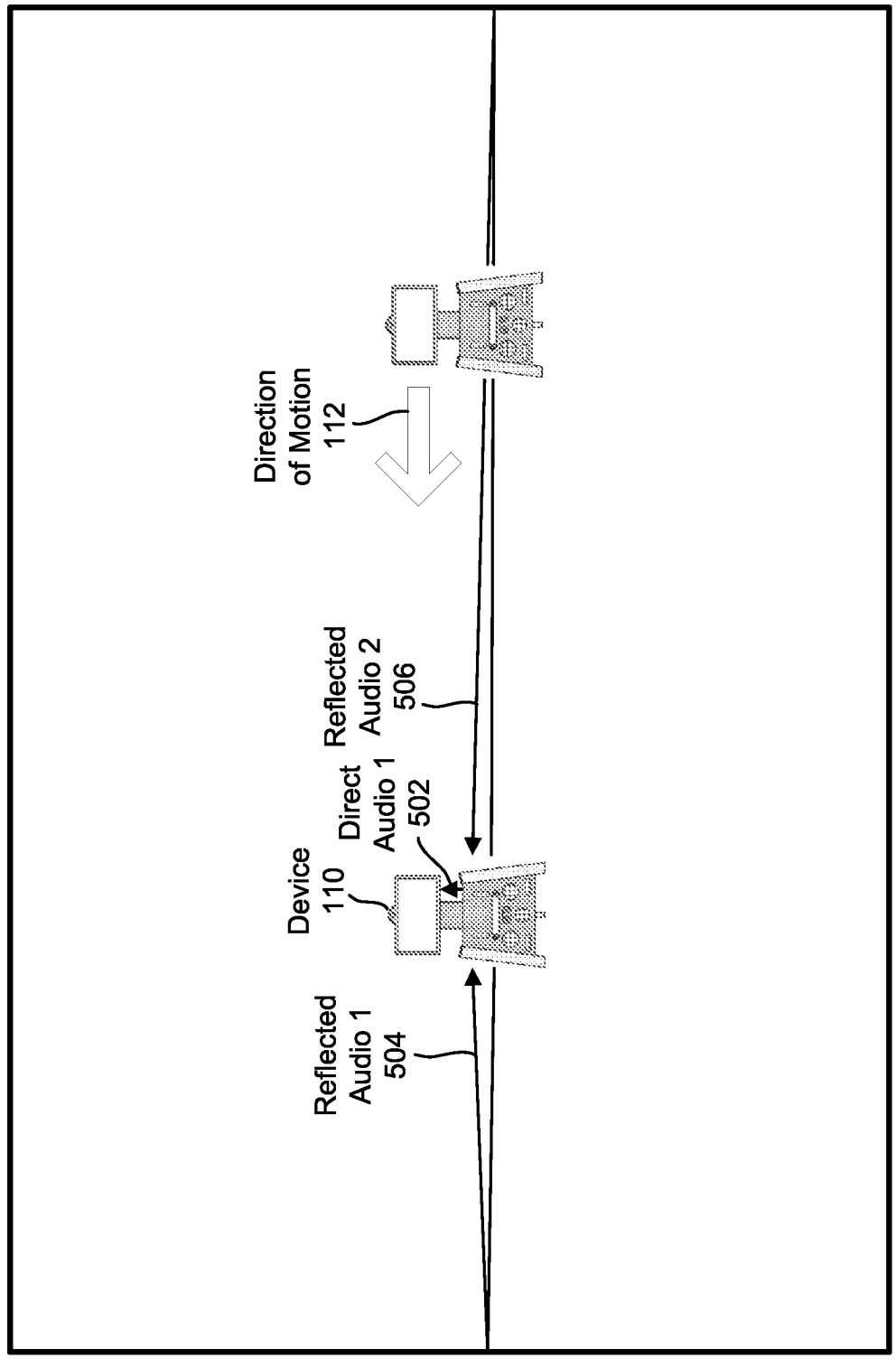

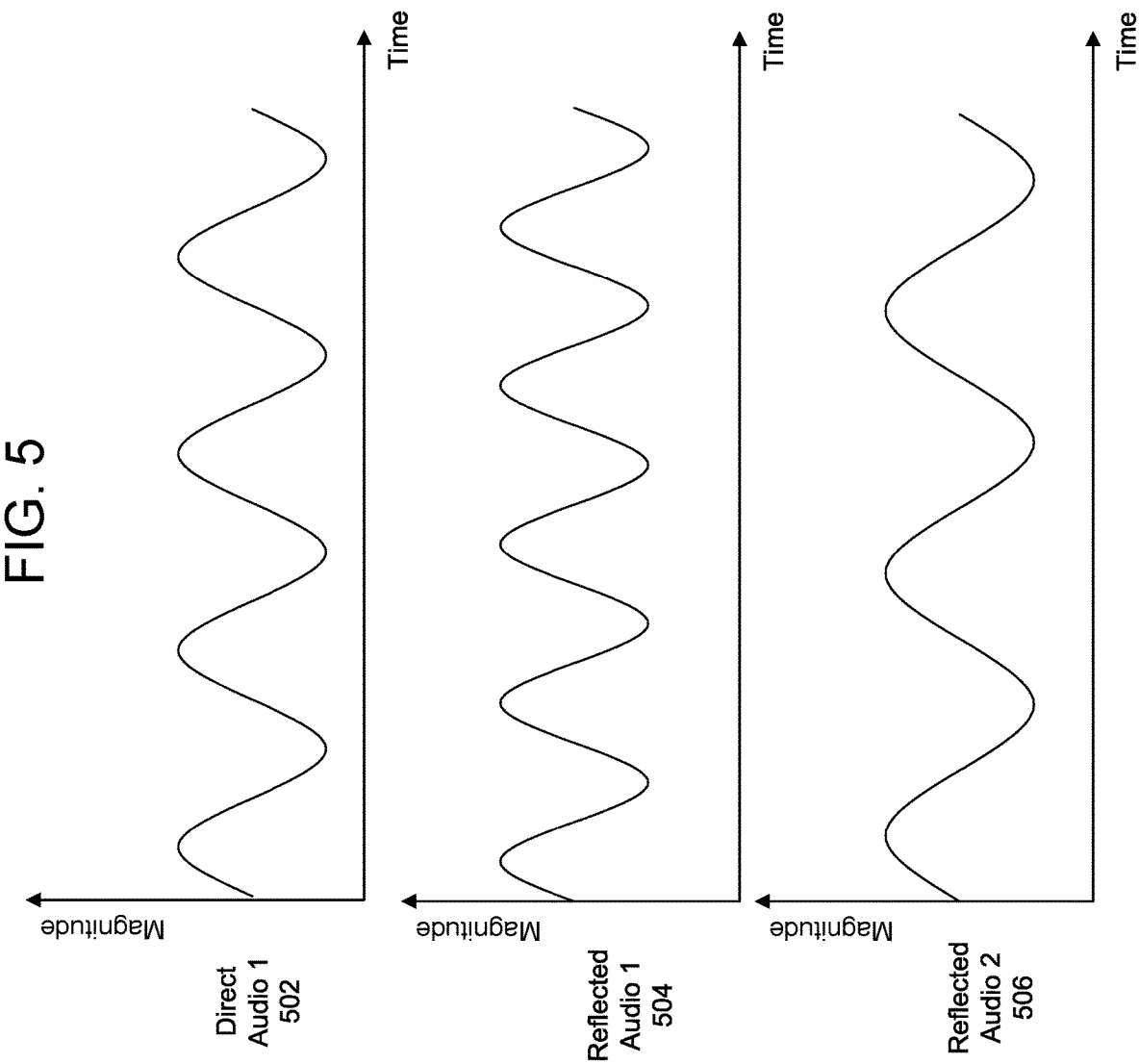

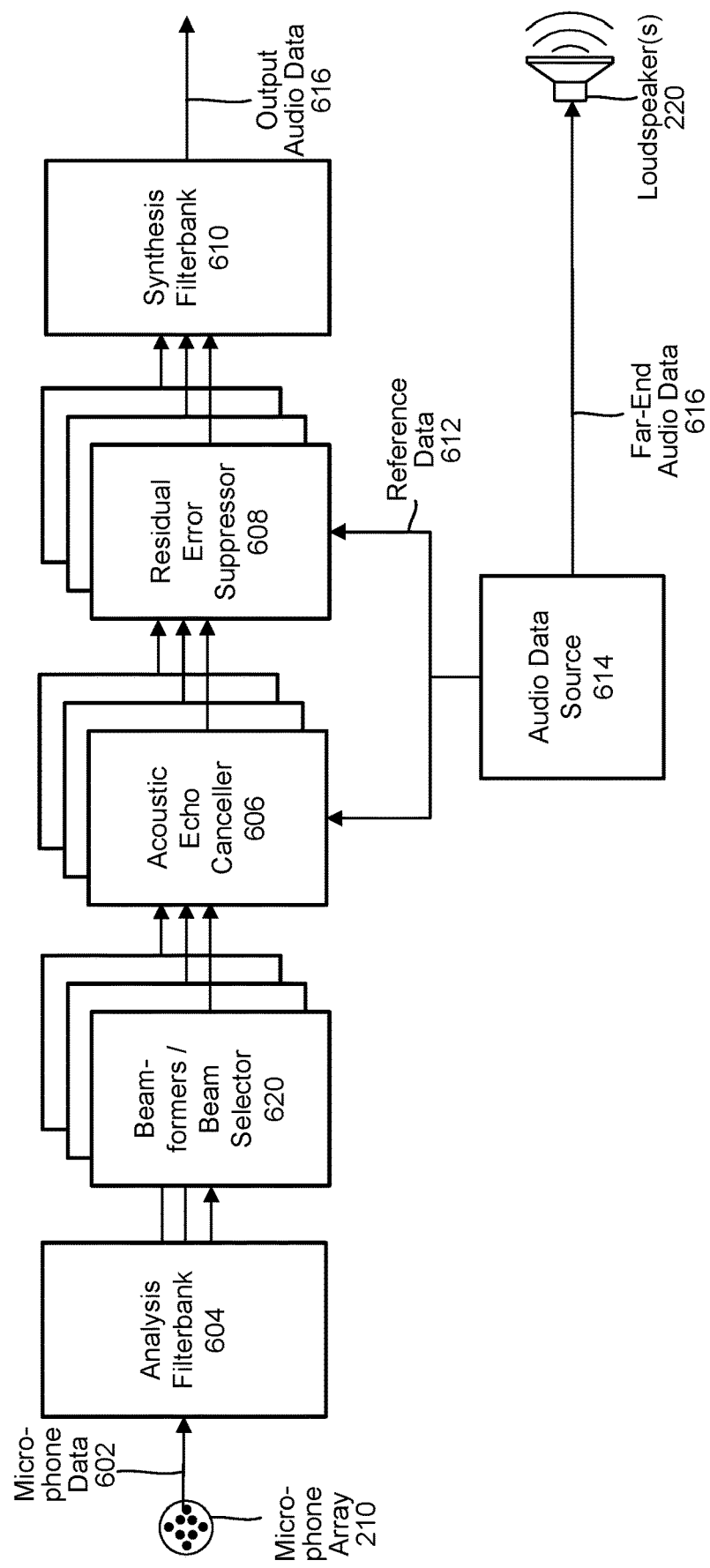

AUTONOMOUSLY MOTILE DEVICE WITH RESIDUAL ECHO SUPPRESSION

BACKGROUND

In audio systems, residual echo suppression refers to techniques that suppress residual error data from audio data. An adaptive filter of an acoustic echo-cancellation system estimates an audio channel between a loudspeaker and at least one microphone; based on this estimate, the adaptive filter modifies a reference signal and subtracts the modified signal from microphone data to generate the residual error data. A residual echo suppression system may then suppress the residual echo from the result.

BRIEF DESCRIPTION OF DRAWINGS

For a more complete understanding of the present disclosure, reference is now made to the following description taken in conjunction with the accompanying drawings.

FIGS. 2A, 2B, and 2C illustrate views of a device capable of autonomous motion according to embodiments of the present disclosure.

FIG. 3 illustrates a microphone array according to embodiments of the present disclosure.

FIG. 4 illustrates an autonomously motile device receiving near-end audio from a loudspeaker according to embodiments of the present disclosure.

FIG. 5 illustrates Doppler-shifted near-end audio according to embodiments of the present disclosure.

FIGS. 6A and 6B illustrates systems using residual echo suppression according to embodiments of the present disclosure.

DETAILED DESCRIPTION

Figure 1:
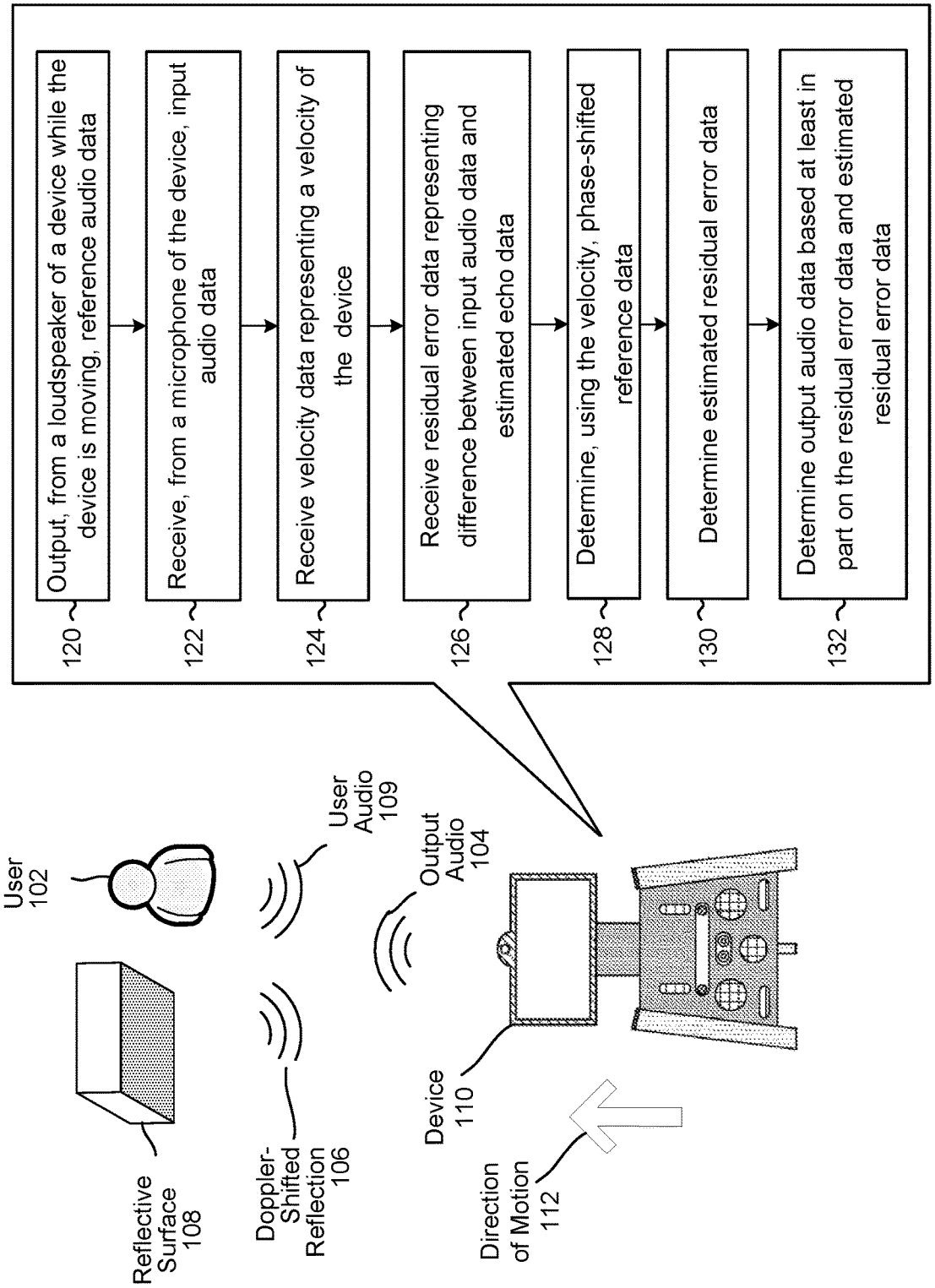
FIG. 1 illustrates a system and method for residual echo suppression using a device capable of autonomous motion according to embodiments of the present disclosure.

An autonomously motile device—e.g., a robot—may include a speech-recognition system. Speech-recognition systems have progressed to a point at which humans may interact with the devices using speech. Such systems employ techniques to identify the words spoken by a human user based on the various qualities of a received audio input. Speech recognition combined with natural-language understanding processing techniques enable speech-based user control of a computing device to perform tasks based on the user's spoken commands. The combination of speech recognition and natural-language understanding processing techniques is commonly referred to as speech processing. Speech processing may also convert a user's speech into text data which may then be provided to various text-based software applications. Speech processing may be used by autonomously motile devices, computers, hand-held devices, telephone computer systems, smart loudspeakers, kiosks, and a wide variety of other devices to improve human-computer interactions. As described herein, an autonomously motile device may include a device that is capable of moving in an environment with or without a direct user command to do so. For example, an autonomously motile device may include wheels mounted on a housing that are driven by a motor; the device may further include sensors for sensing the environment and input/output devices for communicating with a user. The device may use its wheels, motor, sensors, and input/output devices to, for example, follow a user of the device throughout the environment.

Certain devices capable of capturing speech for speech processing may operate using a single microphone or microphone array comprising multiple microphones in which acoustic-echo cancellation techniques operate on the audio captured by the microphone or array. Acoustic-echo cancellation refers to techniques that reduce or eliminate audio output by a separate external loudspeaker disposed in an environment of the autonomously mobile device and/or audio output by a loudspeaker affixed to the autonomously motile device from audio received by a microphone or microphone array of the autonomously motile device. Without acoustic-echo cancellation, sounds output by the loudspeaker(s) would be re-captured by the microphone, and the captured audio data would not just include sounds, such as utterances of a user, local to the device (e.g., "near-end" sounds), but also sounds, such as music or speech, output by the device ("far-end" sounds). As explained in greater detail below, acoustic-echo cancellation subtracts the far-end sounds from received audio data. Because of the Doppler shift described above, however, the far-end sounds output by the device may differ from reflected sounds received by the microphone. This difference may result in less-than-optimal acoustic-echo cancellation.

The autonomously mobile device may also perform residual echo suppression. Residual echo suppression techniques refer to techniques that estimate a residual error and, based on a magnitude spectrum of the residual error, computes a gain and modifies a residual error signal in accordance with that gain. As the term is used herein, residual error refers to a difference between the audio data as received by a microphone and an estimated echo signal. The acoustic echo canceller, described above, may not completely remove the echo, particularly when the acoustic channel changes (when, e.g., the device is moving). The residual echo suppressor may thus be used to further suppress the echo. The residual echo suppressor may be turned off or turned down when near-end speech is detected.

When the autonomously mobile device moves, it may receive audio reflections from nearby reflective surfaces. Because the device is moving, however, these reflections may be affected by Doppler shifts. A Doppler shift refers to changes in audio frequency caused by relative motion between a source of audio (e.g., a loudspeaker) and a recipient of the audio (e.g., a microphone). A first surface in the direction the device is moving may return reflections having a higher frequency than that of the sound output by the device, while a second surface in the opposite direction the device is moving may return reflections having a lower frequency than that of the sound output by the device. In various embodiments of the present disclosure, during estimation of the residual error, the magnitude spectrum of the microphone data is warped to account for the velocity and corresponding Doppler shift. An adaptive algorithm, such as a least-mean-squares algorithm, may then be used to determine weights corresponding to unwarped audio data, positively warped audio data, and/or negatively warped audio data.

The autonomously mobile device may also perform beamforming. In audio systems, beamforming refers to techniques that are used to isolate audio from one or more particular directions. Beamforming may be particularly useful when filtering out noise from non-desired directions. Beamforming may be used for various tasks, including isolating voice commands to be executed by a speech-processing system. A fixed beamformer component may isolate audio from particular directions by applying one or more filters, each having different filter coefficients, to exploit variations in the time each microphone in the array receives audio from each direction. An adaptive beamformer may remove noise by identifying a direction in which a noise source lies and removing that noise from desired audio. A beam selection component selects at least one beam from a plurality of beams corresponding to a desired direction, such as a direction toward which a user is disposed.

Embodiments of the present disclosure thus describe performing residual echo suppression to account for and reduce or eliminate errors that arise due to motion and Doppler shift. In various embodiments, the autonomously motile device moves in a direction with a velocity. As the autonomously motile device moves, its perspective of its environment changes, thus causing audio output by the loudspeaker to behave differently before it is captured by the microphone. This physical environment disposed between the loudspeaker and microphone—which may include physical features of the autonomously motile device itself, as well as reflective surfaces in the environment—is herein referred to as the "channel" of the autonomously motile device. An adaptive filter of an acoustic echo canceller may model this channel; the far-end audio data is processed using the adaptive filter to create an estimation of the audio received by the microphone. The output of the adaptive filter is then subtracted from the received audio to determine the near-end audio. The residual error suppressor may then further process the output of the acoustic echo canceller to suppress noise in the audio.

An adaptive filter of the residual echo suppressor may also update one or more of its coefficients to reflect the changing channel. The adaptive filter may be, for example, a finite-impulse response (FIR) filter that processes audio data to change a magnitude and/or phase of frequencies of the audio data in accordance with the coefficients, which may be a set of weights. The adaptive filter may use an algorithm, such as a least-mean-squares (LMS) algorithm or recursive least-mean-squares (RLMS) algorithm that minimizes or lessens an error signal to compute a new set of coefficients. The autonomously motile device may determine, based on a velocity of the autonomously motile device, an operating parameter of the adaptive filter, such as a step size used to update the coefficients and/or a number of iterations of updating the coefficients, as described in greater detail below.

In various embodiments, the residual echo suppressor estimates a frequency spectrum of noise in the input audio received by one or microphones of the autonomously motile device; this noise may include a representation of audio output by the device itself (as modified by the acoustic channel). The residual echo suppressor may then filter the input audio to suppress the estimated noise. For example, if the device outputs audio that includes a 1 kHz tone, the residual echo suppressor may filter the input audio to remove or reduce sounds having a frequency of 1 kHz. As described further herein, however, the input audio received by the device may include frequencies affected by Doppler shifts. For example, if the device outputs audio that includes the 1 kHz tone, it may receive reflections that include not only the 1 kHz tone but also (e.g.) 0.99 kresidual echo suppressor warps the frequency of the reference signal in accordance with a first factor, based on the velocity of the device, to account for positive Doppler-shifted reflections, and warps the reference signal in accordance with a second factor, also based on the velocity of the device, to account for positive Doppler-shifted reflections.

FIG. 1 illustrates a system that includes an autonomously motile device 110, which is described in greater detail below. In various embodiments, the autonomously motile device 110 is capable of autonomous motion using one or motors powering one or more wheels, treads, robotic limbs, or similar actuators. The autonomously motile device 110 may further be capable of three-dimensional motion (e.g., flight) using one or more rotors, wings, jets, electromagnetic field generators, or similar actuators. The motion may be linear motion and/or angular motion. The present disclosure is not limited to particular method of autonomous movement/motion. The device 110 may, for example, follow a user 102 around a room to thereby allow the user 102 easier access to features of the device 110, such as its voice interface. If the device 110 is moving in a first direction of motion 112 while it outputs audio 104—e.g., an utterance of a far-end user, music, or other audio—the output audio 104 may reflect from one or more reflective surfaces 108; the resultant reflected audio 106 may include a Doppler-shifted reflection. The autonomously motile device 110 may thus receive the Doppler-shifted reflection 106 as well as user audio 109, such as an utterance of the user 102. As described herein, the autonomously motile device 110 may suppress—e.g., reduce or remove—the Doppler-shifted refection 106 from the received audio to isolate the user audio 109.

The device 110 may further include one or more display screens for displaying information to a user 102 and/or receiving touch input from a user. The device 110 may further include a microphone array including one or more microphones and one or more loudspeakers; the microphone array and loudspeakers may be used to receive audio data, such as an utterance, from the user 102. The utterance may be, for example, a command or request. The device 110 may also be used to output audio to the user 102, such as audio related to a command or audio related to a request.

The device 110 may further include one or more sensors; these sensors may include, but are not limited to, an accelerometer, a gyroscope, a magnetic field sensor, an orientation sensor, a weight sensor, a temperature sensor, and/or a location sensor (e.g., a global-positioning system (GPS) sensor or a Wi-Fi round-trip time sensor). The device may further include a computer memory, a computer processor, and one or more network interfaces. The device 110 may be, in some embodiments, a robotic assistant or "robot" that may move about a room or rooms to provide a user with requested information or services. In other embodiments, the device 110 is capable of rotation but not linear motion; the device 110 may be mounted or placed on a surface or floor, for example, and may rotate in place to face a user 102. The disclosure is not, however, limited to only these devices or components, and the device 110 may include additional components without departing from the disclosure.

In various embodiments, with reference to FIG. 1, the autonomously motile device 110 outputs (120), from a loudspeaker device while the autonomously motile device is moving with a velocity, reference audio data. The autonomously motile device 110 receives (122), from a microphone of, input audio data, the input audio data including a representation of the reference audio data. The autonomously motile device 110 receives (124) velocity data representing the velocity of the autonomously motile device.

The autonomously motile device 110 receives (126) (from, e.g., an acoustic echo canceller) residual error data corresponding to a difference between input audio data and estimated echo data. The autonomously motile device 110 determines (128), based at least in part on the velocity data and the reference audio data, warped reference audio data. The autonomously motile device 110 determines (130), based at least in part on the residual error data, the reference audio data, and the warped reference audio data, estimated residual error data. The autonomously motile device 110 determines (132), based at least in part on the residual error data and the estimated residual error data, output audio data.

Figure 2A:
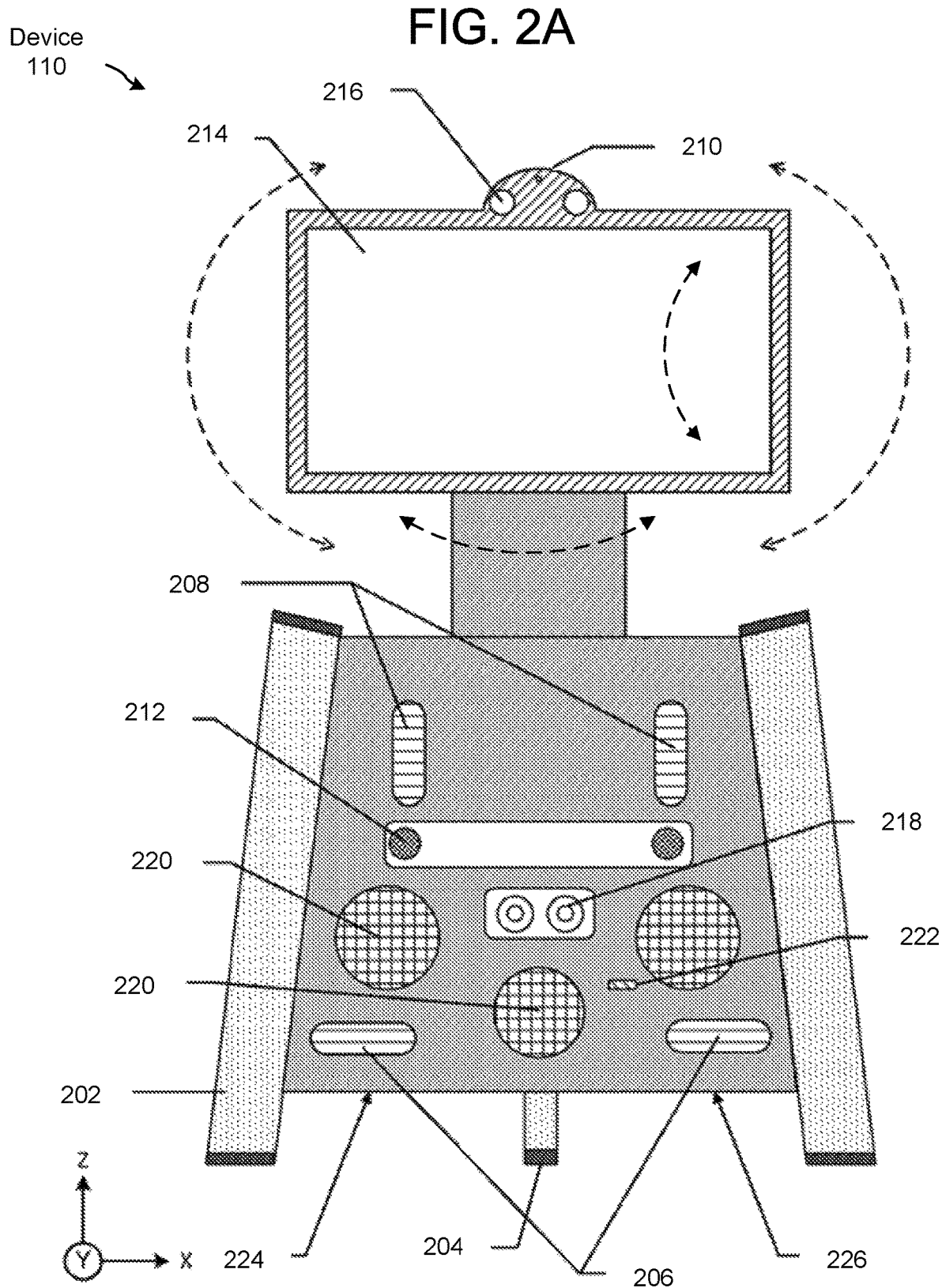

FIG. 2A illustrates a front view of the autonomously motile device 110 according to various embodiments of the present disclosure. The device 110 includes wheels 202 disposed on left and right sides of a lower structure. The wheels 202 may be canted inwards toward an upper structure. In other embodiments, however, the wheels 202 may be mounted vertically. A caster 204 (i.e., a smaller wheel) may disposed along a midline of the device 110. The front section of the device 110 may include a variety of external sensors. A first set of optical sensors 206 may be disposed along the lower portion of the front, and a second set of optical sensors 208 may be disposed along an upper portion of the front. A microphone array 210 may be disposed on a top surface of the device 110; the microphone array 210 may, however, be disposed on any surface of the device 110.

One or more cameras 212 may be mounted to the front of the device 110; two cameras 212 may be used to provide for stereo vision. The distance between two cameras 212 may be, for example, 5-15 centimeters; in some embodiments, the distance is 10 centimeters. In some embodiments, the cameras 212 may exhibit a relatively wide horizontal field-of-view (HFOV). For example, the HFOV may be between 90° and 110°. A relatively wide FOV may provide for easier detection of moving objects, such as users or pets, which may be in the path of the device 110. Also, the relatively wide FOV may provide for the device 110 to more easily detect objects when rotating or turning.

Cameras 212 used for navigation may be of different resolution from, or sensitive to different wavelengths than, other cameras 212 used for other purposes, such as video communication. For example, navigation cameras 212 may be sensitive to infrared light allowing the device 110 to operate in darkness or semi-darkness, while a camera 216 mounted above a display 214 may be sensitive to visible light and may be used to generate images suitable for viewing by a person. A navigation camera 212 may have a resolution of at least 300 kilopixels each, while the camera 216 mounted above the display 214 may have a resolution of at least 10 megapixels. In other implementations, navigation may utilize a single camera 212.

The cameras 212 may operate to provide stereo images of the environment, the user, or other objects. For example, an image from the camera 216 disposed above the display 214 may be accessed and used to generate stereo-image data corresponding to a face of a user. This stereo-image data may then be used for facial recognition, user identification, gesture recognition, gaze tracking, and other uses. In some implementations, a single camera 216 may be disposed above the display 214.

The display 214 may be mounted on a movable mount. The movable mount may allow the display to move along one or more degrees of freedom. For example, the display 214 may tilt, pan, change elevation, and/or rotate. In some embodiments, the display 214 may be approximately 8 inches as measured diagonally from one corner to another.

An ultrasonic sensor 218 may be mounted on the front of the device 110 and may be used to provide sensor data that is indicative of objects in front of the device 110.

One or more loudspeakers 220 may be mounted on the device 110, and the loudspeakers 220 may have different audio properties. For example, low-range, mid-range, and/or high-range loudspeakers 220 may be mounted on the front of the device 110. The loudspeakers 220 may be used to provide audible output such as alerts, music, human speech such as during a communication session with another user, and so forth.

Other output devices 222, such as one or more lights, may be disposed on an exterior of the device 110. For example, a running light may be arranged on a front of the device 110. The running light may provide light for operation of one or more of the cameras, a visible indicator to the user that the device 110 is in operation, or other such uses.

One or more floor optical motion sensors (FOMS) 224, 226 may be disposed on the underside of the device 110. The FOMS 224, 226 may provide indication indicative of motion of the device 110 relative to the floor or other surface underneath the device 110. In some embodiments, the FOMS 224, 226 comprise a light source, such as light-emitting diode (LED) and/or an array of photodiodes. In some implementations, the FOMS 224, 226 may utilize an optoelectronic sensor, such as an array of photodiodes. Several techniques may be used to determine changes in the data obtained by the photodiodes and translate this into data indicative of a direction of movement, velocity, acceleration, and so forth. In some implementations, the FOMS 224, 226 may provide other information, such as data indicative of a pattern present on the floor, composition of the floor, color of the floor, and so forth. For example, the FOMS 224, 226 may utilize an optoelectronic sensor that may detect different colors or shades of gray, and this data may be used to generate floor characterization data.

Figure 2B:
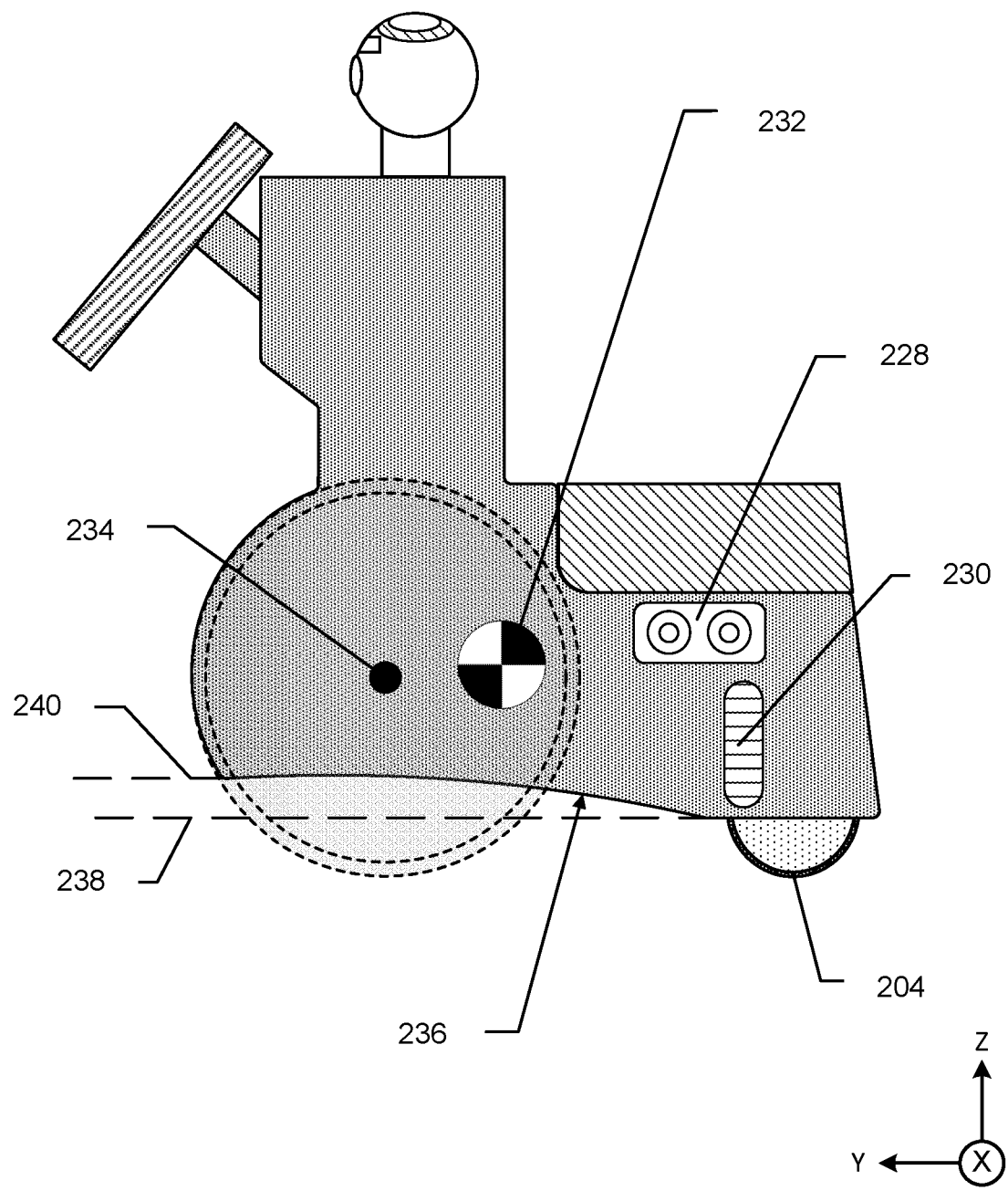

FIG. 2B illustrates a side view of the device 110 according to various embodiments of the present disclosure. In this side view, the left side of the device 110 is illustrated. An ultrasonic sensor 228 and an optical sensor 230 may be disposed on either side of the device 110.

The disposition of components of the device 110 may be arranged such that a center of gravity 232 is located between a wheel axle 234 of the front wheels 202 and the caster 204. Such placement of the center of gravity 232 may result in improved stability of the device 110 and may also facilitate lifting by a carrying handle.

In this illustration, the caster 204 is shown in a trailing configuration, in which the caster 204 is located behind or aft of the wheel axle 234 and the center of gravity 232. In another implementation (not shown) the caster 204 may be in front of the axle of the wheels 202. For example, the caster 204 may be a leading caster 204 positioned forward of the center of gravity 232.

The device 110 may encounter a variety of different floor surfaces and transitions between different floor surfaces during the course of its operation. A contoured underbody 236 may transition from a first height 238 at the front of the device 110 to a second height 240 that is proximate to the caster 204. This curvature may provide a ramp effect such that, if the device 110 encounters an obstacle that is below the first height 238, the contoured underbody 236 helps direct the device 110 over the obstacle without lifting the driving wheels 202 from the floor.

FIG. 2C illustrates a rear view of the device 110 according to various embodiments of the present disclosure. In this view, as with the front view, a first pair of optical sensors 242 are located along the lower edge of the rear of the robot 100, while a second pair of optical sensors 244 are located along an upper portion of the rear of the device 110. An ultrasonic sensor 246 may provide proximity detection for objects that are behind the device 110.

Charging contacts 248 may be provided on the rear of the device 110. The charging contacts 248 may include electrically conductive components that may be used to provide power (to, e.g., charge a battery) from an external source such as a docking station to the device 110. In other implementations, wireless charging may be utilized. For example, wireless inductive or wireless capacitive charging techniques may be used to provide electrical power to the device 110.

In some embodiments, the wheels 202 may include an electrically conductive portion 250 and provide an electrical conductive pathway between the device 110 and a charging source disposed on the floor. One or more data contacts 252 may be arranged along the back of the device 110. The data contacts 252 may be configured to establish contact with corresponding base data contacts within the docking station. The data contacts 252 may provide optical, electrical, or other connections suitable for the transfer of data.

Other output devices 260, such as one or more lights, may be disposed on an exterior of the back of the device 110. For example, a brake light may be arranged on the back surface of the device 110 to provide users an indication that the device 110 is slowing or stopping.

The device 110 may include a modular payload bay 254. In some embodiments, the modular payload bay 254 is located within the lower structure. The modular payload bay 254 may provide mechanical and/or electrical connectivity with the device 110. For example, the modular payload bay 254 may include one or more engagement features such as slots, cams, ridges, magnets, bolts, and so forth that are used to mechanically secure an accessory within the modular payload bay 254. In some embodiments, the modular payload bay 254 includes walls within which the accessory may sit. In other embodiments, the modular payload bay 254 may include other mechanical engagement features such as slots into which the accessory may be slid and engage. The device 110 may further include a mast 256, which may include a light 258.

FIG. 3 illustrates further details of the microphone array 210. In some embodiments, the microphone array 210 includes eight microphones 302*a*, 302*b*, 302*c*, 302*d*, 302*e*, 302*f*, 302*g*, and 302*h*, arranged in two concentric circles; the four microphones of one circle are rotated 45 degrees with respect to the four microphones of the other circle. The present disclosure is not, however limited to any particular number or arrangement of microphones. In particular, the autonomously motile device may feature only a single microphone.

The microphone array 210 may include a number of different individual microphones. The individual microphones may capture sound and pass the resulting audio signals created by the sound to downstream components, as discussed below. Each individual piece of audio data captured by a microphone may be in the time domain; these signals may be converted to the frequency domain using an analysis filterbank, as described below. Acoustic echo cancellation may be performed on each time-domain or frequency-domain signal individually or on groups of signals. The acoustic echo cancellation may be performed before or after processing the signals using the beamforming techniques described herein.

To isolate audio from a particular direction, as discussed herein, the device 110 may compare the audio data (or audio signals related to the audio data, such as audio signals in a sub-band domain) to determine a time difference of detection of a particular segment of audio data. If the audio data for a first microphone includes the segment of audio data earlier in time than the audio data for a second microphone, then the device 110 may determine that the source of the audio that resulted in the segment of audio data may be located closer to the first microphone than to the second microphone (which resulted in the audio being detected by the first microphone before being detected by the second microphone).

FIG. 4 illustrates the autonomously motile device 110 receiving near-end audio from its own loudspeaker 220 according to embodiments of the present disclosure. The autonomously motile device 110 receives direct audio 502 output by the loudspeaker 220 and received by the microphone 210. By "direct," the direct audio 502 passes through the environment and is received by a microphone 210 of the autonomously motile device 110 without reflecting off a surface of the environment. The direct audio 502 may, however, be attenuated in accordance with the distance between the loudspeaker 220 and the autonomously motile device 110.

The autonomously motile device 110 may further receive reflected audio 504, 506 that has reflected off of one or more reflective surfaces 108 in the environment of the autonomously motile device 110. Some reflected audio, such as reflected audio 1 504, may be wholly or partially in the direction of motion 112 of the autonomously motile device 110. This audio may include Doppler effects that increase the frequency of the audio output by the device 110. Other audio, such as reflected audio 506, may be wholly or partially opposite the direction of motion 112 of the autonomously motile device 110. This audio may include Doppler effects that decrease the frequency of the audio output by the device 110. FIG. 5 illustrates example waveforms of the direct audio 502, reflected audio 1 504, and reflected audio 2 506. As illustrated the frequency of the reflected audio 1 504 is greater than that of the direct audio 1 502, while the frequency of the reflected audio 2 506 is less than that of the direct audio 1 502.

Figure 6A:
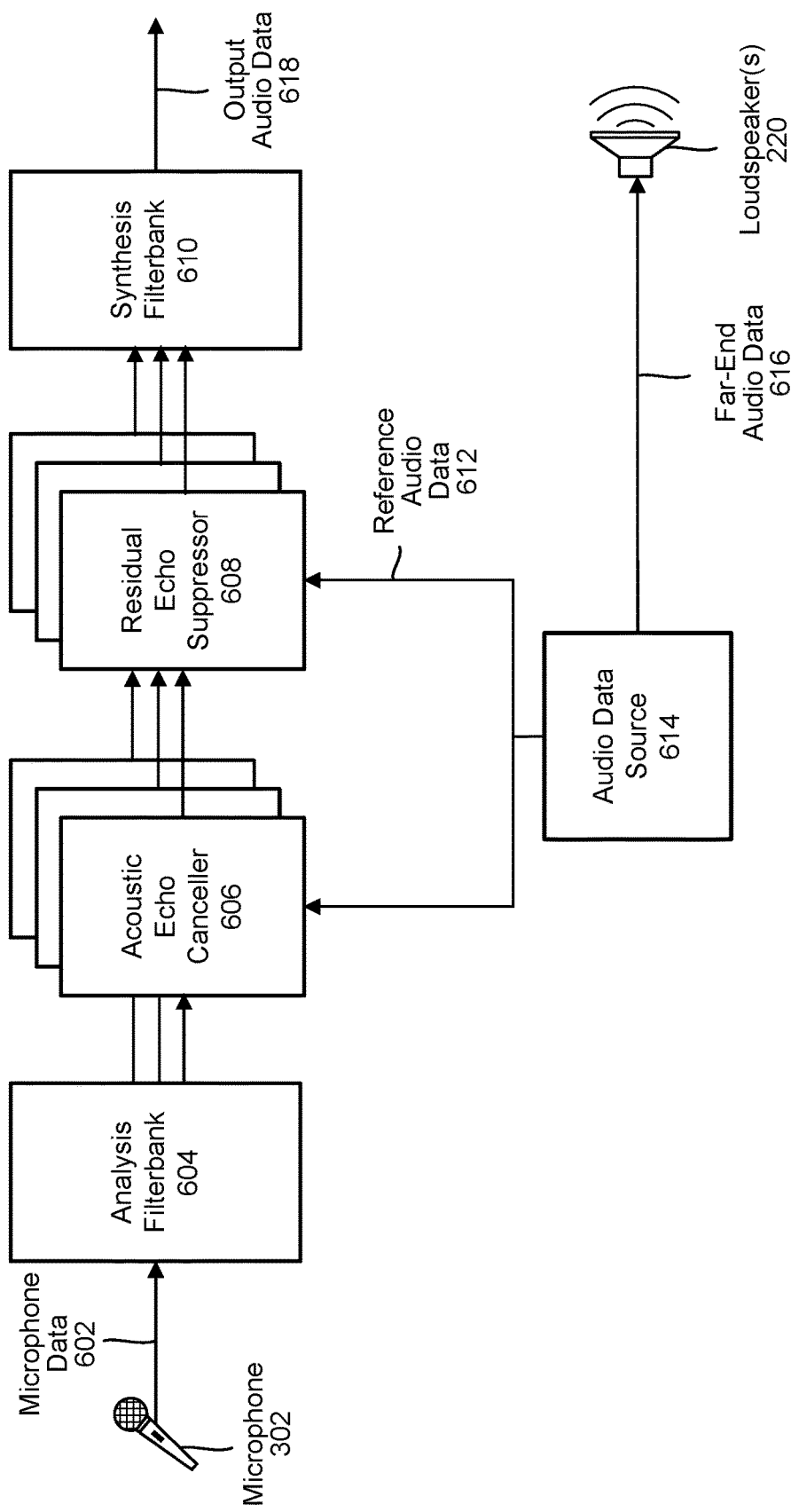

FIGS. 6A and 6B illustrate systems for audio processing that include residual echo suppression, which includes compensation for Doppler-shifted output audio reflections according to embodiments of the present disclosure. For clarity, single instances of each component of the system may be illustrated; one of skill in the art will understand, however, that the system may include multiple instances of each component in accordance with each microphone 302 of the microphone array 210, each frequency bin, and/or each reference signal. In some embodiments, the system includes eight microphones and 128 frequency bins. An overview of the system is first presented in the below paragraphs; each component is then described in greater detail.

In various embodiments, the microphone 302 receives audio corresponding to the environment of the device 110 and transduces the audio into microphone data 602. An analysis filterbank 604 converts the audio data 602 into frequency-domain audio data and may further separate the frequency-domain audio data into two or more frequency ranges or "bins." An acoustic-echo cancellation component 606 may be used to remove reference audio data 612 from the frequency-domain audio data; this reference audio data 612 may be received from an audio data source 614, such as a far-end participant on a voice or video call. The far-end audio data 616 may be output using a loudspeaker 220; the microphone data 602 may include at least a portion of the far-end audio data 616 and/or reflections of the far-end audio data 616.

The analysis filterbank 604 may perform a Fourier transform, such as a fast Fourier transform (FFT), and may include one or more uniform discrete Fourier transform (DFT) filterbanks, which convert the time-domain audio data 602 into the frequency-domain audio data. The frequency-domain audio data may include a plurality of audio signals Y in the sub-band domain. The audio signals Y may incorporate audio signals corresponding to multiple different microphones 302 as well as different sub-bands (i.e., frequency ranges) as well as different frame indices (i.e., time ranges). Thus, the microphone data 602 from the mth microphone 302 may be represented as $X_m(k,n)$, where k denotes the sub-band index, and n denotes the frame index. The combination of all audio signals for all m microphones 302 for a particular sub-band index frame index may be represented as $X(k,n)$.

The acoustic-echo cancellation component 606 may subtract reference audio data 612 from the frequency-domain audio data using, for example, hardware and/or software configured to subtract data representing a first signal from data representing a second signal. The acoustic-echo cancellation component 606 may include an adaptive filter, such as a finite impulse-response (FIR) filter, that is configured to minimize an error signal between an output of the filter and the near-end audio. Multiple acoustic echo cancellers 606 may be used for each microphone 302 and/or for each frequency bin. Multiple acoustic echo cancellers 606 may further be used for multiple reference audio data 612, such as left-and-right stereo reference signals.

A residual echo suppression component 608 may further process the audio data to further suppress echoes not fully removed by the acoustic-echo cancellation component. As explained in greater detail below with respect to FIGS. 7A and 7B, the residual echo suppression component 608 may determine, based on a velocity of the autonomously motile device 110, an estimation of the residual error that includes Doppler effects and process the audio data using a magnitude spectrum of the residual error.

A synthesis filterbank 610 may be used to convert the frequency-domain data back to time-domain output audio data 618 using, for example, an inverse Fourier transform (such as an Inverse Fast Fourier Transform (IFFT). The output audio data 618 may then be used for further audio processing, such as speech processing.

FIG. 6B is similar to FIG. 6B in that it depicts an audio processing system that includes at least one analysis filterbank 604, at least one acoustic echo cancellation component 606, at least one residual echo suppression component 608, and at least one synthesis filterbank 608. The system of FIG. 6B, however, includes the microphone array 210 that includes more than one microphone 302. One or more beamformers/beam selectors 620 may process the data from the microphone array 210 to determine two or more beams and select one or more of the beams.

In various embodiments, the beamformer/selector 620 is a fixed or adaptive beamformer/selector configured to determine directional audio data in accordance with values of a matrix, referred to herein as a covariance matrix. The beamformer/selector 620 boosts audio from a target direction while suppressing audio from other directions As described herein, beamforming (e.g., performing a direction-based separation of audio data) corresponds to generating a plurality of directional audio signals (e.g., beamformed audio data) corresponding to individual directions relative to the microphone array 210. A first beam may correspond to first beamformed audio data associated with a first direction (e.g., portions of the input audio signals corresponding to the first direction), a second beam may correspond to second beamformed audio data associated with a second direction (e.g., portions of the input audio signals corresponding to the second direction), and so on. As used herein, "beams" refer to the beamformed audio signals that are generated by the beamforming operation. Therefore, a first beam corresponds to first audio data associated with a first direction, whereas a first directional calculation corresponds to the first filter coefficient values used to generate the first beam.

For example, the beamforming operation may individually filter input audio signals generated by multiple microphones 302 in the microphone array 210 (e.g., first audio data associated with a first microphone, second audio data associated with a second microphone, etc.) in order to separate audio data associated with different directions. Thus, first beamformed audio data corresponds to audio data associated with a first direction, second beamformed audio data corresponds to audio data associated with a second direction, and so on.

To perform the beamforming operation, the beamformer/selector 620 may apply directional calculations to the input audio signals. In some examples, the beamformer/selector 620 may perform the directional calculations by applying filters to the input audio signals using filter coefficient values associated with specific directions. For example, the beamformer/selector 620 may perform a first directional calculation by applying first filter coefficient values to the input audio signals to generate the first beamformed audio data and may perform a second directional calculation by applying second filter coefficient values to the input audio signals to generate the second beamformed audio data.

In one example of a beamformer system, a fixed beamformer employs a filter-and-sum structure to boost an audio signal that originates from a desired direction (sometimes referred to as the look-direction) while largely attenuating audio signals that original from other directions. A fixed beamformer unit may effectively eliminate certain diffuse noise (e.g., undesirable audio), which is detectable in similar energies from various directions, but may be less effective in eliminating noise emanating from a single source in a particular non-desired direction. The beamformer may further include an adaptive beamformer that may adaptively cancel noise from different directions, depending on audio conditions.

Beamforming may be performed by determining filter coefficient values (e.g., Finite Impulse Response (FIR) filter coefficient values) for each beam direction (e.g., look direction, direction of interest, etc.) based on a position of physical microphones in the microphone array 210. For example, a first position of a first physical microphone may correspond to a first filter coefficient associated with a first direction and a second position of a second physical microphone may correspond to a second filter coefficient associated with the first direction. Thus, to generate beamformed audio data in the first direction, the beamformer may apply the first filter coefficient value to first audio data captured by the first physical microphone and apply the second filter coefficient value to second audio data captured by the second physical microphone.

The filter coefficient values may be determined using minimum variance distortionless response (MVDR) beamformer techniques, Linearly Constrained Minimum Variance (LCMV) beamformer techniques, and/or generalized eigenvalue (GEV) beamformer techniques, although the disclosure is not limited thereto and the filter coefficient values may be determined using any technique known to one of skill in the art without departing from the disclosure.

The filter coefficient values used to perform the beamforming operations may be calculated offline (e.g., preconfigured ahead of time) and stored in the device 110. In various embodiments, a computer model of the device 110 may be constructed using, for example, computer-aided design (CAD) software. The model may then be analyzed using a finite-element model (FEM) application; based on the FEM analysis, the acoustic properties of each microphone 302 may be determined for each incident angle. These properties may then be used to determine the values of the above-referenced matrices.

The beamformer/selector 620 receives the two or more adapted beam data and, in accordance with the various techniques described herein, such as selecting a loudest beam, selects data corresponding to a selected beam. The beamformer/selector 620 may select one or more of the beams as output beams. For example, the beam selector 620 may determine one or more signal quality values (e.g., loudness, SNR, power value, signal-to-noise plus interference ratio (SINR), and/or other signal quality metrics known to one of skill in the art) associated with each of the adapted beam data and may select the adapted beam data having the highest signal quality metric as the selected beam. In various embodiments, the beamformer/selector 620 is capable of selecting a new beam every 100-200 milliseconds.

Figure 7A:
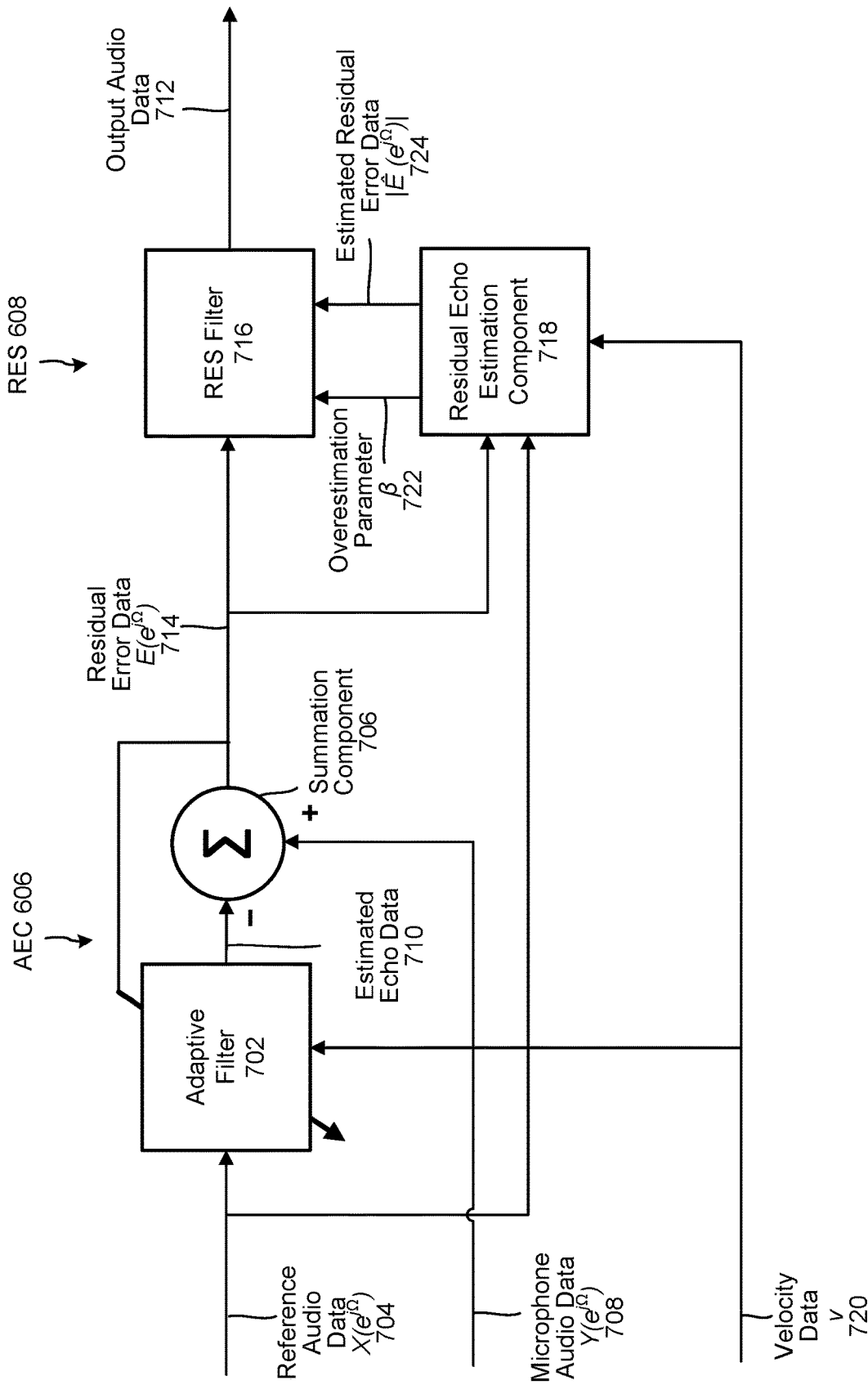
FIGS. 7A and 7B illustrate residual echo suppression according to embodiments of the present disclosure.
Figure 7B:
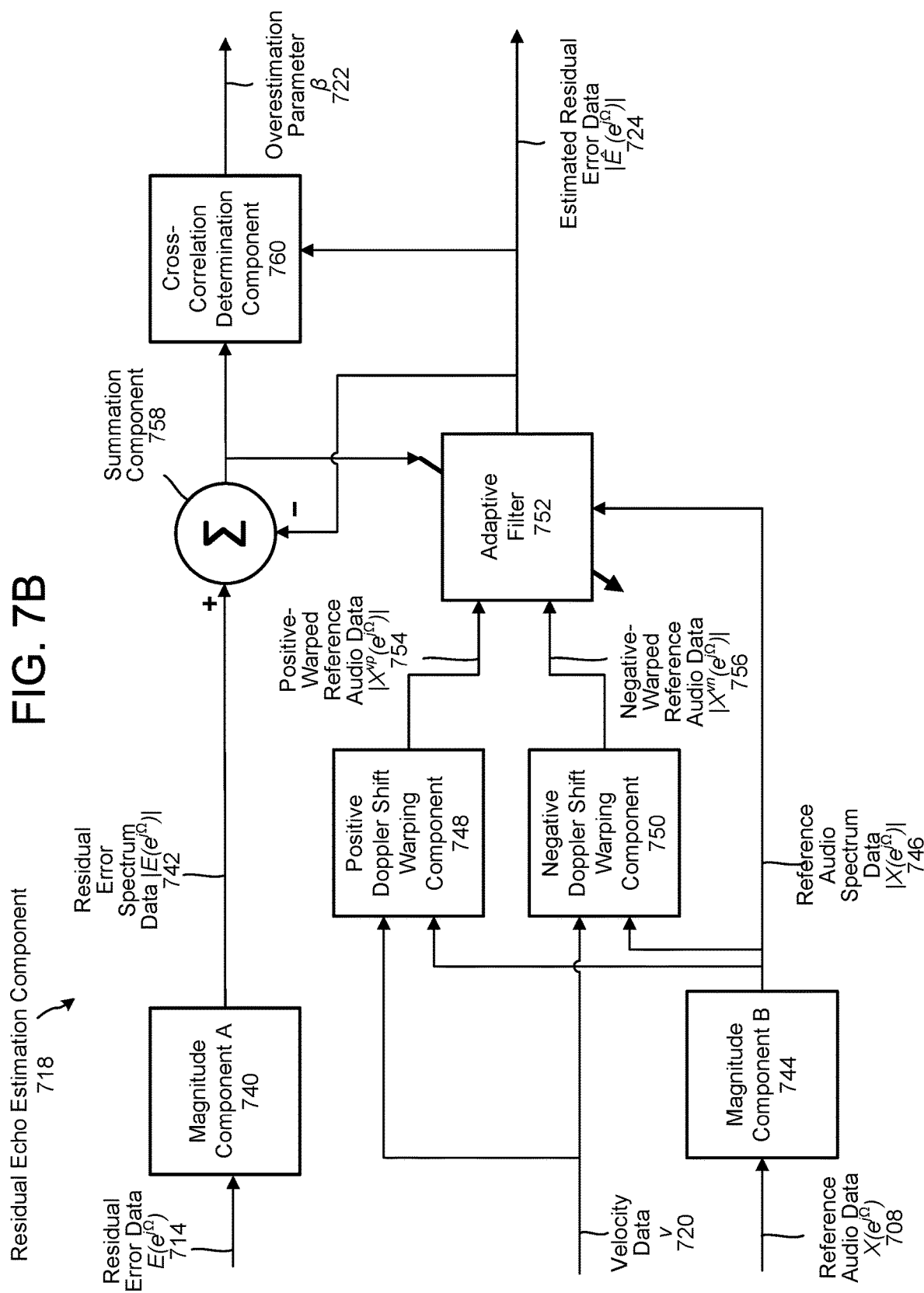

FIGS. 7A and 7B illustrate residual echo suppression systems according to embodiments of the present disclosure. Referring first to FIG. 7A, an residual echo suppression component 608 includes an adaptive filter 702 that receives reference audio data $X(e^{j\Omega})$ 704 from, for example, a local source of music, a far-end speaker, or other source. A summation component 706 subtracts the estimated echo data 710 output by the adaptive filter 702 from microphone audio data 704 $Y(e^{j\Omega})$ (received from the analysis filterbank 604 and/or beamformer 620) to create residual error data $E(e^{j\Omega})$ 714. The adaptive filter 702 thus models the audio channel between a microphone 302 and the loudspeaker 220. The residual error data $E(e^{j\Omega})$ 714 thus represents an approximation of audio as received by the microphone 302. The adaptive filter 702 may compute updated filter coefficients based on the output audio data 710 using a step size, which may vary with a velocity of the device 110. The velocity data 720 be determined by processing the outputs of one or more sensors, such as an accelerometer or wheel-speed sensor.

The adaptive filter 702 may include one or more adjustable FIR filters that estimate the acoustic properties of a channel of the environment of the device 110 based on one or more transfer functions. The portion of the audible sound output by the loudspeaker 220 that reaches the microphone array 210 may be characterized based on one or more transfer functions. The number of transfer functions may vary depending on the number of loudspeakers 220 and/or microphones 302. For example, a first portion of the sound output by the loudspeaker 220 and captured by a first microphone 302 in the microphone array 210 may be characterized by a first transfer function, and a second portion of the sound output by the loudspeaker 220 and captured by a second microphone in the microphone array 210 may be characterized by a second transfer function. The transfer functions may vary with the relative positions of the components and the acoustics of the room (e.g., environment surrounding the device 110). If the position of all of the objects in the room are static, the transfer functions are likewise static. When the device 110 moves, however, the transfer functions may change.

The residual echo suppressor 608 may include a filter 716 and a residual echo estimation component 718. The filter 716 may process the estimated error data $E(e^{j\Omega})$ 710 in accordance with estimated residual error data $\hat{E}(e^{j\Omega})$ 724 and/or an overestimation parameter β 722, which may be determined by the residual echo estimation component 718. The filter 716 may output corresponding output audio data 712, which may be further processed by (e.g.) the beamformer 620 and/or synthesis filterbank 608 before further processing (e.g., speech processing).

The filter 716 may be a Wiener filter, or other such filter that may perform spectral shaping, and may comprise or include a finite impulse-response filter. The residual error data $E(e^{j\Omega})$ 714 may be expressed using the below equation (1).

$$e(n)=y(n)-\hat{d}(n) \quad (1)$$

In equation (1), e(n) represents the residual error data $E(e^{j\Omega})$ 714, y(n) represents the microphone audio data 704 $Y(e^{j\Omega})$, and $\hat{d}(n)$ represents the estimated echo data 710. The microphone audio data 704 $Y(e^{j\Omega})$ 704 may also be expressed as a combination of a speech signal s(n), a background noise signal b(n), and an echo signal d(n) in accordance with the below equation (2).

$$y(n)=s(n)+b(n)+d(n) \quad (2)$$

A residual echo signal $e_u(n)$ may be defined as the difference between the echo signal d(n) and the estimated echo signal $\hat{d}(n)$ in accordance with the below equation (3).

$$e_u(n)=d(n)-\hat{d}(n) \quad (3)$$

The residual error data $E(e^{j\Omega})$ 714 may thus be expressed as a sum of the speech signal s(n), the background noise signal b(n), and the residual echo signal $e_u(n)$ in accordance with the below equation (4).

$$e(n)=s(n)+b(n)+e_u(n) \quad (4)$$

If the background noise b(n) is ignored, the total noise ñ(n) may thus be expressed as being equal to the residual echo signal $e_u(n)$, as shown below in the next equation (5).

$$ñ(n)=e_u(n) \quad (5)$$

The gain $\hat{H}_w(e^{j\Omega})$ of the filter 716 may thus bet expressed using the below equation (6).

$$\hat{H}_W(e^{j\Omega}) = \max\left\{1 - \beta \frac{\hat{S}_{e_u e_u}(\Omega, n)}{\hat{S}_{ee}(\Omega, n)}, H_{min}\right\} \quad (6)$$

In the above equation (6), $H_{min}$ is the maximum attenuation of the filter (which may be, for example, between 0.0 and 1.0), β is the overestimation parameter 722 (which may be, for example, between 0.0 and 2.0), $\hat{S}_{ee}(\Omega,n)$ is the spectral power density of the residual error data $E(e^{j\Omega})$ 714, and $\hat{S}_{e_u e_u}(\Omega,n)$ is the undisturbed error spectral density, which are correspondingly defined by the below equations (7) and (8).

$$\hat{S}_{ee}(\Omega,n)=\gamma\hat{S}_{ee}(\Omega,n-1)+(1-\gamma)|e(\Omega,n)|^2 \quad (7)$$

$$\hat{S}_{e_u e_u}(\Omega,n)=\hat{S}_{xx}(\Omega,n)|\hat{G}(e^{j\Omega},n)|^2 \quad (8)$$

In the above equations (7) and (8), $\hat{G}(e^{j\Omega},n)$ represents the mismatch in system estimation; this mismatch may be estimated as a regression of the ratio of the power spectrum of the residual error data $\hat{S}_{ee}(\Omega,n)$ to the power spectrum of the reference data $\hat{S}_{xx}(\Omega,n)$.

FIG. 7B illustrates additional details of the residual echo estimation component 718. The residual echo estimation component 718 may estimate the residual echo by determining a moving average model for the relationship between the power spectrum $\hat{S}_{ee}(\Omega,n)$ of the residual error data 714 to the power spectrum $\hat{S}_{xx}(\Omega,n)$ of the reference audio data 704 (and/or the power spectrum of the estimated echo data 710).

In various embodiments, a first magnitude component A 740 determines residual error magnitude data $E(e^{j\Omega})$ 742 from the residual error data $E(e^{j\Omega})$ 714. Similarly, a second magnitude component B 744 determines reference audio magnitude data $X(e^{j\Omega})$ 746 from the reference audio data $X(e^{j\Omega})$ 708. The magnitude components 740, 744 may, for example, include discrete Fourier transform (DFT) components for performing a discrete Fourier transform on input data, and may take the absolute value of and/or square the results.

A positive Doppler-shift warping component 748 and a negative Doppler-shift warping component 750 may generate positive warped reference audio data $|X^{vp}(e^{j\Omega})|$ 754 and negative warped reference audio data $|X^{vp}(e^{j\Omega})|$ 756, respectively. The positive Doppler-shift warping component 748 may warp the frequency spectrum of the reference audio spectrum data $|X(e^{j\Omega})|$ 746 by processing it in accordance with equation (9) below, and the negative Doppler-shift warping component 748 may warp the frequency spectrum of the reference audio spectrum data $|X(e^{j\Omega})|$ 746 by processing it in accordance with equation (10) below. Any type of frequency warping (e.g., scaling, linear transformation, and/or use of kernel functions) is, however, within the scope of the present disclosure.

$$X^{vp}(e^{j\Omega})=X(e^{j(1+2v/c)\Omega}) \quad (9)$$

$$X^{vn}(e^{j\Omega})=X(e^{j(1-2v/c)\Omega}) \quad (10)$$

In the above equations (9) and (10), v is the velocity of the device 110 as represented the velocity data 720. This velocity v may be a linear and/or angular velocity. Also in the above equations (9) and (10), c is the speed of sound (e.g., 343 meters per second at 20° C.). The components 748, 750 may thus be or include filters that warp the reference audio spectrum data $|X(e^{j\Omega})|$ 746 in accordance with factors (1+2v/c) or (1−2v/c) to generate warped reference audio data 754, 756.

An adaptive filter 752 may thereafter process the reference audio spectrum data $|X(e^{j\Omega})|$ 746, positive-warped reference audio data $|X^{vp}(e^{j\Omega})|$ 754, and negative-warped reference audio data $|X^{vp}(e^{j\Omega})|$ 756 to determine estimated residual error data $\hat{E}(e^{j\Omega})$ 724. The adaptive filter 752 may process the data in accordance with three weights $w_k$, $w_k^{vp}$, and $w_k^{vp}$, in accordance with the below equation (10).

$$\hat{E}(\Omega, n) = \sum_{k=0}^{N-1} w_k |X(e^{j\Omega}, n-k)| + \sum_{k=0}^{N-1} w_k^{vp}|X^{vp}(e^{j\Omega}, n-k)| + \sum_{k=0}^{N-1} w_k^{vn}|X^{vn}(e^{j\Omega}, n-k)| \quad (10)$$

A summation component 758 may be used to find the difference between the estimated residual error data $\hat{E}(e^{j\Omega})$ 724 and the residual error spectrum data $|E(e^{j\Omega})|$ 742. The adaptive filter may thus minimize the difference represented by the output of the summation component 758 using, for example, a normalized least-mean-squares algorithm. The weights $w_k$, $w_k^{vp}$, and $w_k^{vp}$ that minimize the difference may thus be used to process the reference audio spectrum data $|X(e^{j\Omega})|$ 746, positive-warped reference audio data $|X^{vp}(e^{j\Omega})|$ 754, and negative-warped reference audio data $|X^{np}(e^{j\Omega})|$ 756.

As mentioned above, the RES filter 716 may use an overestimation parameter β 722 to determine a degree of suppression. If the overestimation parameter β 722 is low (e.g., 0.1), the RES filter 716 performs no or only weak suppression (e.g., the RES filter 716 reduces a particular frequency of the residual error data $E(e^{j\Omega})$ 714 by only a small amount (e.g., 0-5%). If the overestimation parameter β 722 is moderate (e.g., 1.0), the RES filter 716 performs moderate suppression (e.g., 50%). If the overestimation parameter β 722 is high (e.g., 2.0), the RES filter 716 performs strong suppression (e.g., 100%). The overestimation parameter β 722 may be any value.

In some embodiments, the overestimation parameter β 722 changes based on detection of near-end talk or crosstalk (detection of both near-end and far-end talk). If crosstalk is detected, the overestimation parameter β 722 is set low, while if no crosstalk is detected, the overestimation parameter β 722 is set high.

A cross-correlation determination component 760 may be used to determine a level of cross-correlation between the estimated residual error data $\hat{E}(e^{j\Omega})$ 724 and the output of the summation component 758 (e.g., the difference between the estimated residual error data $\hat{E}(e^{j\Omega})$ 724 and the residual error spectrum data $|E(e^{j\Omega})|$ 742). If the cross-correlation determination component 760 determines that the cross-correlation is less than a first threshold (e.g., 25%), it may determine that the overestimation parameter β 722 is large (e.g., 2.0). If the cross-correlation determination component 760 determines that the cross-correlation is greater than the first threshold (e.g., 25%) but less than a second threshold (e.g., 50%), it may determine that the overestimation parameter β 722 is medium (e.g., 1.0). If the cross-correlation determination component 760 determines that the cross-correlation is greater than the second threshold (e.g., 25%), it may determine that the overestimation parameter β 722 is small (e.g., 0.1).

Figure 8:
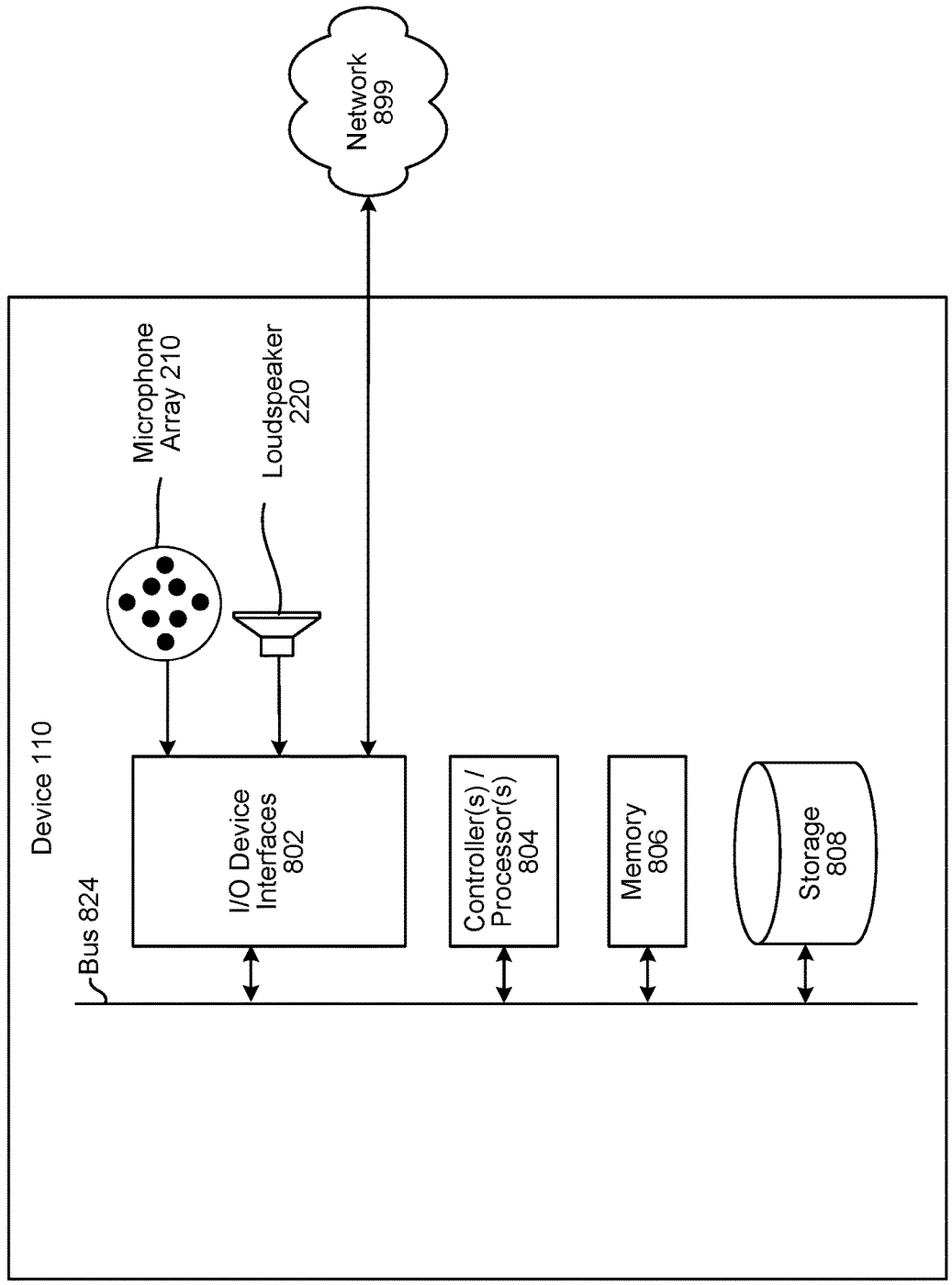
FIG. 8 illustrates a system for residual echo suppression according to embodiments of the present disclosure.

FIG. 8 is a block diagram conceptually illustrating example components of the device 110. In operation, the device 110 may include computer-readable and computer-executable instructions that reside on the device, as will be discussed further below.

The device 110 may include one or more audio capture device(s), such as a microphone array 210 which may include a plurality of microphones. The audio capture device(s) may be integrated into a single device or may be separate. The device 110 may also include a built-in audio output device for producing sound, such as built-in loudspeaker(s) 220. The audio output device may be integrated into a single device or may be separate. The device 110 may include an address/data bus 824 for conveying data among components of the device 110. Each component within the device may also be directly connected to other components in addition to (or instead of) being connected to other components across the bus 824.

The device 110 may include one or more controllers/processors 804, which may each include a central processing unit (CPU) for processing data and computer-readable instructions, and a memory 806 for storing data and instructions. The memory 806 may include volatile random access memory (RAM), non-volatile read only memory (ROM), non-volatile magnetoresistive (MRAM) and/or other types of memory. The device 110 may also include a data storage component 808, for storing data and controller/processor-executable instructions (e.g., instructions to perform operations discussed herein). The data storage component 808 may include one or more non-volatile storage types such as magnetic storage, optical storage, solid-state storage, etc. The device 110 may also be connected to removable or external non-volatile memory and/or storage (such as a removable memory card, memory key drive, networked storage, etc.) through the input/output device interfaces 802.

Computer instructions for operating the device 110 and its various components may be executed by the controller(s)/processor(s) 804, using the memory 806 as temporary "working" storage at runtime. The computer instructions may be stored in a non-transitory manner in non-volatile memory 806, storage 808, or an external device. Alternatively, some or all of the executable instructions may be embedded in hardware or firmware in addition to or instead of software.

The device 110 may include input/output device interfaces 802. A variety of components may be connected through the input/output device interfaces 802, such as the microphone array 210, the built-in loudspeaker(s) 220, and a media source such as a digital media player (not illustrated). The input/output interfaces 802 may include A/D converters (not illustrated) and/or D/A converters (not illustrated).

The input/output device interfaces 802 may also include an interface for an external peripheral device connection such as universal serial bus (USB), FireWire, Thunderbolt or other connection protocol. The input/output device interfaces 802 may also include a connection to one or more networks 899 via an Ethernet port, a wireless local area network (WLAN) (such as WiFi) radio, Bluetooth, and/or wireless network radio, such as a radio capable of communication with a wireless communication network such as a Long Term Evolution (LTE) network, WiMAX network, 3G network, etc. Through the network 899, the device 110 may be distributed across a networked environment.

Multiple devices may be employed in a single device 110. In such a multi-device device, each of the devices may include different components for performing different aspects of the processes discussed above. The multiple devices may include overlapping components. The components listed in any of the figures herein are exemplary, and may be included a stand-alone device or may be included, in whole or in part, as a component of a larger device or system.

Figure 9:
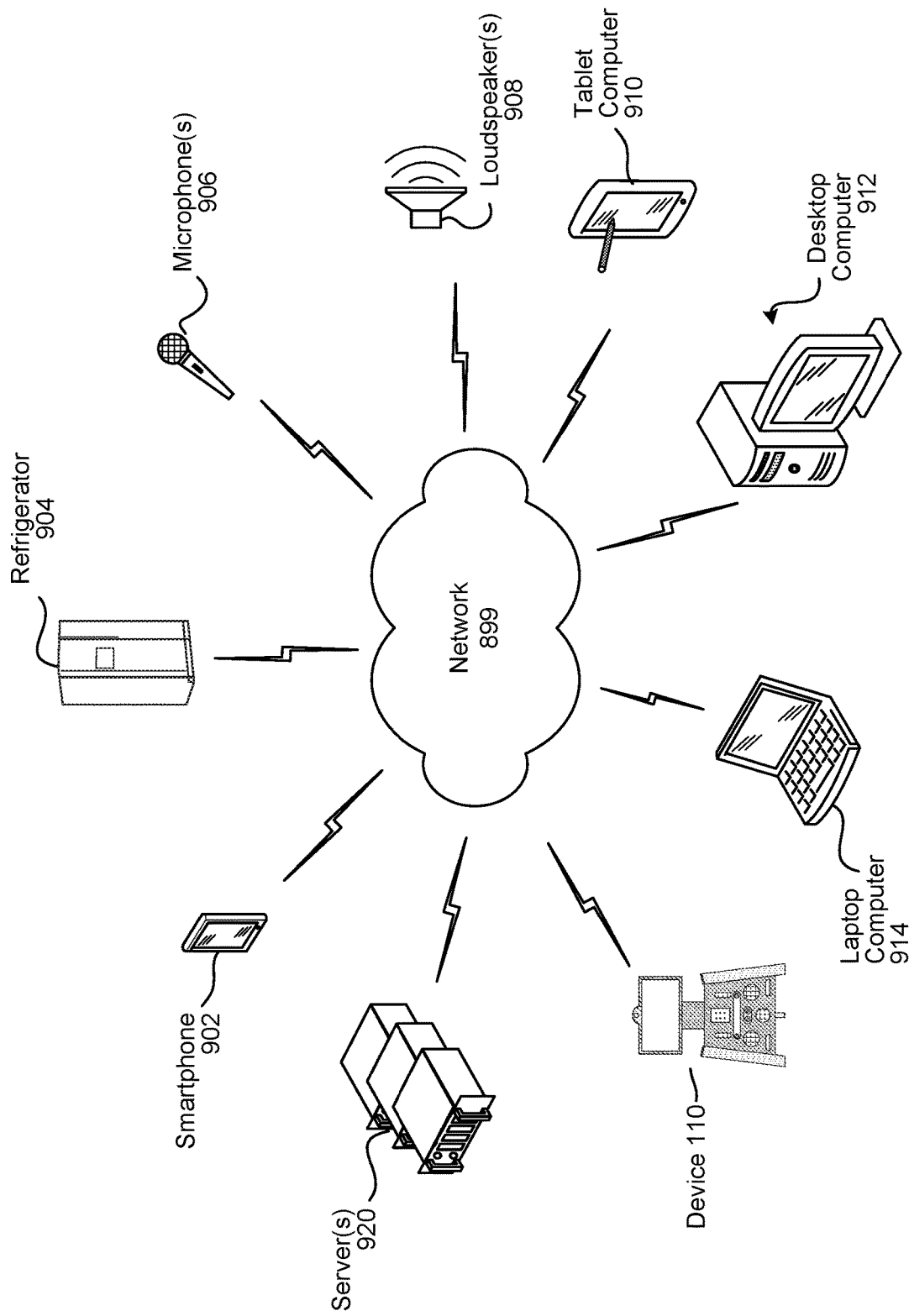
FIG. 9 illustrates a network including a system for residual echo suppression according to embodiments of the present disclosure.

As illustrated in FIG. 9, the device 110 may be connected over the network(s) 899. The network(s) 899 may include a local or private network or may include a wide network such as the Internet. Devices may be connected to the network(s) 899 through either wired or wireless connections. For example, the device 110, a smart phone 802, a smart refrigerator 904, a wireless microphone 906, a wireless loudspeaker 908, a tablet computer 910, a desktop computer 912, and/or a laptop computer 914 may be connected to the network(s) 899 through a wireless service provider, over a WiFi or cellular network connection, or the like. Other devices are included as network-connected support devices, such as a server 920. The support devices may connect to the network(s) 899 through a wired connection or wireless connection.

The concepts disclosed herein may be applied within a number of different devices and computer systems, including, for example, general-purpose computing systems, multimedia set-top boxes, televisions, stereos, radios, server-client computing systems, telephone computing systems, laptop computers, cellular phones, personal digital assistants (PDAs), tablet computers, wearable computing devices (watches, glasses, etc.), other mobile devices, etc.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of digital signal processing and echo cancellation should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk and/or other media. Some or all of the device 110 may be implemented by a digital signal processor (DSP).

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements, and/or steps are in any way required for one or more embodiments or that one or more embodiments necessarily include logic for deciding, with or without other input or prompting, whether these features, elements, and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. As used in this disclosure, the term "a" or "one" may include one or more items unless specifically stated otherwise. Further, the phrase "based on" is intended to mean "based at least in part on" unless specifically stated otherwise.

What is claimed is:

1. A computer-implemented method comprising:
   outputting reference audio data from a loudspeaker of an autonomously motile device while the autonomously motile device is in motion;
   receiving input audio data from a microphone of the autonomously motile device, the input audio data including a representation of the reference audio data;
   determining speed data representing a speed of the autonomously motile device;
   determining estimated echo data;
   determining, by the autonomously motile device, residual error data corresponding to a difference between the input audio data and the estimated echo data;
   determining, by the autonomously motile device, warped reference audio data based at least in part on the speed data and the reference audio data;
   determining, by the autonomously motile device, estimated residual error data based at least in part on the residual error data, the reference audio data, and the warped reference audio data; and
   determining, by the autonomously motile device, output audio data based at least in part on the residual error data and the estimated residual error data.

2. The computer-implemented method of claim 1, wherein determining the warped reference audio data comprises:
   determining positive warped reference audio data representing a positive Doppler shift; and
   determining negative warped reference audio data representing a negative Doppler shift.

3. The computer-implemented method of claim 2, wherein:
   determining the positive warped reference audio data comprises multiplying the residual error data by (1+a ratio between the speed of the autonomously motile device and a speed of sound); and
   determining the negative warped reference audio data comprises multiplying the residual error data by (1−the ratio).

4. The computer-implemented method of claim 1, further comprising:
   determining a difference between the residual error data and the estimated residual error data;
   determining, based at least in part on the difference, a first weight corresponding to the residual error data and a second weight corresponding to the warped reference audio data; and
   determining the estimated residual error data further based at least in part on processing, using an adaptive filter, the first weight, the second weight, the reference audio data, and the warped reference audio data.

5. The computer-implemented method of claim 1, further comprising:
   determining a value representing a cross-correlation between the estimated residual error data and a difference between the estimated residual error data and the residual error data; and
   determining that the value is less than a threshold value.

6. The computer-implemented method of claim 4, wherein determining the output audio data comprises:
   determining a first power spectrum of the estimated residual error data;
   determining a second power spectrum of the difference between the residual error data and the estimated residual error data;
   determining a gain of a filter by dividing the first power spectrum into the second power spectrum; and
   processing, using the filter, the residual error data to generate the output audio data.

7. The computer-implemented method of claim 1, further comprising:
   determining the estimated echo data using a first adaptive filter, the estimated echo data representing an estimate of the input audio data received by the microphone; and
   determining the residual error data by subtracting the estimated echo data from the input audio data.

8. The computer-implemented method of claim 1, wherein the input audio data comprises:
   first reflected audio data including a component having a frequency greater than a frequency of a corresponding component of the reference audio data, and
   second reflected audio data including a component having a frequency less than a frequency of a corresponding component of the reference audio data.

9. The computer-implemented method of claim 1, further comprising:
   determining a value representing a cross-correlation between second estimated residual error data and a second difference between the second estimated residual error data and second residual error data;
   determining that the value is greater than a threshold value corresponding to an amount near-end audio represented in the input audio data; and
   generating second output audio data equal to the second residual error data.

10. The computer-implemented method of claim 1, wherein determining the warped reference audio data further comprises:
    determining a magnitude spectrum of the reference audio data.

11. An autonomously motile device comprising:
    at least one processor; and
    at least one memory including instructions that, when executed by the at least one processor, cause the autonomously motile device to:
    output reference audio data from a loudspeaker of the autonomously motile device while the autonomously motile device is in motion;
    receive input audio data from a microphone of the autonomously motile device, the input audio data including a representation of the reference audio data;
    determine speed data representing a speed of the autonomously motile device;
    determine estimated echo data;
    determine residual error data corresponding to a difference between the input audio data and the estimated echo data;
    determine warped reference audio data based at least in part on the speed data and the reference audio data;
    determine estimated residual error data based at least in part on the residual error data, the reference audio data, and the warped reference audio data; and
    determine output audio data based at least in part on the residual error data and the estimated residual error data.

12. The autonomously motile device of claim 11, wherein the at least one memory further comprises instructions that, when executed by the at least one processor, further cause the autonomously motile device to:
    determine positive warped reference audio data representing a positive Doppler shift; and determine negative warped reference audio data representing a negative Doppler shift.

13. The autonomously motile device of claim 12, wherein the at least one memory further comprises instructions that, when executed by the at least one processor, further cause the autonomously motile device to:

determine the positive warped reference audio data comprises multiplying a phase of the residual error data by (1+a ratio between the speed of the autonomously motile device and speed of sound); and determine the negative warped reference audio data comprises multiplying the phase of the residual error data by (1−the ratio).

14. The autonomously motile device of claim 11, wherein the at least one memory further comprises instructions that, when executed by the at least one processor, further cause the autonomously motile device to:

determine a difference between the residual error data and the estimated residual error data;

determine, based at least in part on the difference, a first weight corresponding to the residual error data and a second weight corresponding to the warped reference audio data; and determine the estimated residual error data further based at least in part on processing, using an adaptive filter, the first weight, the second weight, the reference audio data and the warped reference audio data.

15. The autonomously motile device of claim 11, wherein the at least one memory further comprises instructions that, when executed by the at least one processor, further cause the autonomously motile device to:

determine a value representing cross-correlation between the estimated residual error data and a difference between the estimated residual error data and the residual error data; and determine that the value is less than a threshold value corresponding to an amount near-end audio represented in the input audio data.

16. The autonomously motile device of claim 11, wherein the at least one memory further comprises instructions that, when executed by the at least one processor, further cause the autonomously motile device to:

determine a first power spectrum of the estimated residual error data;

determine a second power spectrum of the difference between the residual error data and the estimated residual error data;

determine a gain of a filter by dividing the first power spectrum into the second power spectrum; and process, using the filter, the residual error data to generate the output audio data.

17. The autonomously motile device of claim 11, wherein the at least one memory further comprises instructions that, when executed by the at least one processor, further cause the autonomously motile device to:

determine the estimated echo data using a first adaptive filter, the estimated echo data representing an estimate of the input audio data received by the microphone; and determine the residual error data by subtracting the estimated echo data from the input audio data.

18. The autonomously motile device of claim 11, wherein the input audio data comprises:

first reflected audio data including a component having a frequency greater than a frequency of a corresponding component of the reference audio data, and second reflected audio data including a component having a frequency less than a frequency of a corresponding component of the reference audio data.

19. The autonomously motile device of claim 11, wherein the at least one memory further comprises instructions that, when executed by the at least one processor, further cause the autonomously motile device to:

determine a value representing a cross-correlation between second estimated residual error data and a second difference between the second estimated residual error data and second residual error data;

determine that the value is greater than a threshold value corresponding to an amount near-end audio represented in the input audio data; and generate second output audio data equal to the second residual error data.

20. A computer-implemented method comprising:

outputting reference audio data from a loudspeaker of an autonomously motile device while the autonomously motile device is in motion, the reference audio data including human-perceivable audio;

receiving input audio data from a microphone of the autonomously motile device, the input audio data including speech and a representation of the reference audio data;

determining speed data representing a speed of the autonomously motile device;

determining estimated echo data;

determining residual error data corresponding to a different between the input audio data and the estimated echo data;

determining warped reference audio data based at least in part on the speed data and the reference audio data; and determining, by the autonomously motile device, output audio data based at least in part on the speed data, the input audio data, the residual error data, and the warped reference audio data.

21. The computer-implemented method of claim 20, further comprising:

determining estimated residual error data based at least in part on the residual error data, the reference audio data, and the warped reference audio data; and determining the output audio data further based at least in part on the estimated residual error data.

* * * * *